United States Patent [19]

Harwood et al.

[11] 4,019,152
[45] Apr. 19, 1977

[54] BIAS CIRCUIT FOR JUNCTION DIODES

[75] Inventors: Leopold Albert Harwood, Somerville; Erwin Johann Wittmann, North Plainfield, both of N.J.

[73] Assignee: RCA Corporation, New York, N.Y.

[22] Filed: Aug. 25, 1975

[21] Appl. No.: 607,491

[52] U.S. Cl. .......................... 330/29; 307/318; 307/320; 330/30 D; 357/13; 358/27
[51] Int. Cl.² ........................................ H03G 3/30
[58] Field of Search ............ 307/320, 318; 330/29, 330/30 D; 358/27

[56] References Cited

UNITED STATES PATENTS

| | | | |
|---|---|---|---|
| 3,461,395 | 8/1969 | Racy | 330/29 |
| 3,663,836 | 5/1972 | Fernandez-Sein | 307/320 X |
| 3,962,718 | 6/1976 | Inove | 357/48 |

OTHER PUBLICATIONS

Stoner— "Diodes"— *Radio Electronics*, pp. 38, 39, Feb. 1961.

*Primary Examiner*—Rudolph V. Rolinec
*Assistant Examiner*—Lawrence J. Dahl
*Attorney, Agent, or Firm*—Eugene M. Whitacre; Ronald H. Kurdyla

[57] ABSTRACT

An integratable bias circuit for semiconductor junction diodes of the type exhibiting junction capacitance when reverse biased by suitable applied voltages includes a source of fixed bias reference voltage applied to the diode junction. The reference voltage is selected less than the reverse conduction breakdown voltage of the diode junction to prevent diode operation beyond its reverse breakdown potential while also reliably determining the junction capacitance.

10 Claims, 3 Drawing Figures

BIAS CIRCUIT FOR JUNCTION DIODES

This invention relates to biasing circuits for semiconductor junction capacitors and, more particularly, to such circuits for use in phase control networks such as may be employed in the chrominance channel of a color television receiver.

Circuits employing the present invention are particularly adapted to integrated circuit techniques. As used herein, the term integrated circuit refers to a unitary or monolithic semiconductor device or chip which is the equivalent of a network of interconnected active and passive circuit elements.

In many electrical circuits, it is desirable to employ a capacitor having a voltage-responsive capacitance. For example, such a capacitor can be used to determine the frequency of an oscillator or as a reactive element in a phase shift network. In the case of monolithic integrated circuits (as well as in discrete component circuits), reverse biased semiconductor junction diodes are often used to provide such a capacitance. Conventional semiconductor junction diodes comprise bodies of P-type and N-type conductivity semiconductor material defining a junction therebetween. The diode junction exhibits a capacity which varies with reverse biasing potential applied to the junction, thereby manifesting a capacitance-voltage characteristic suitable for numerous electronic circuit purposes.

In practical circuit applications, such variable capacitance junction diodes are subject to a limitation in that they exhibit a suitable high resistance and capacitance voltage characteristic only when operating in the reverse conduction region without exceeding the reverse voltage breakdown limit of the junction. If, in operation, the diode reverse conduction breakdown voltage is exceeded, the diode will present a low impedance or an effective short-circuit. Such a low impedance condition may have an adverse effect upon circuits with which the diode is used by rendering such circuits completely inoperative or by seriously degrading their performance.

For example, when using a junction diode as the capacitive element of an oscillator resonant circuit requiring high Q (figure of merit) and/or high shunt resistance, it is necessary to insure that the diode does not assume a low impedance characteristic. An another example, a capacitance junction diode may be employed as the reactive element of a phase shift network. For this case, operating the diode beyond its reverse breakdown point results in a drastically different value of capacitance and hence drastically changes the intended phase shifting function of the diode capacitance. Also, the operating characteristics of the source of signals to be phase shifted, coupled to the capacitance junction diode, may be impaired if the diode is caused to operate beyond its reverse conduction breakdown voltage, thereby presenting an undesired low impedance to the signal source. Junction diodes employed as capacitance devices consequently require careful biasing where relatively large applied voltages approaching the breakdown voltage can be expected.

Accordingly, apparatus in accordance with the present invention comprises a semiconductor device having a PN junction exhibiting a capacitance thereacross when reverse biased, and a source of substantially constant bias reference voltage having a magnitude less than the reverse conduction breakdown voltage of the PN junction. The source of reference voltage is coupled to the device to reverse bias the PN junction, thereby reliably determining the junction capacitance and inhibiting operation of the device beyond the junction reverse breakdown voltage in the presence of applied voltages of a magnitude tending to cause such operation.

For a detailed explanation, reference is made to the following specification and accompanying drawings, in which.

Figure 1:
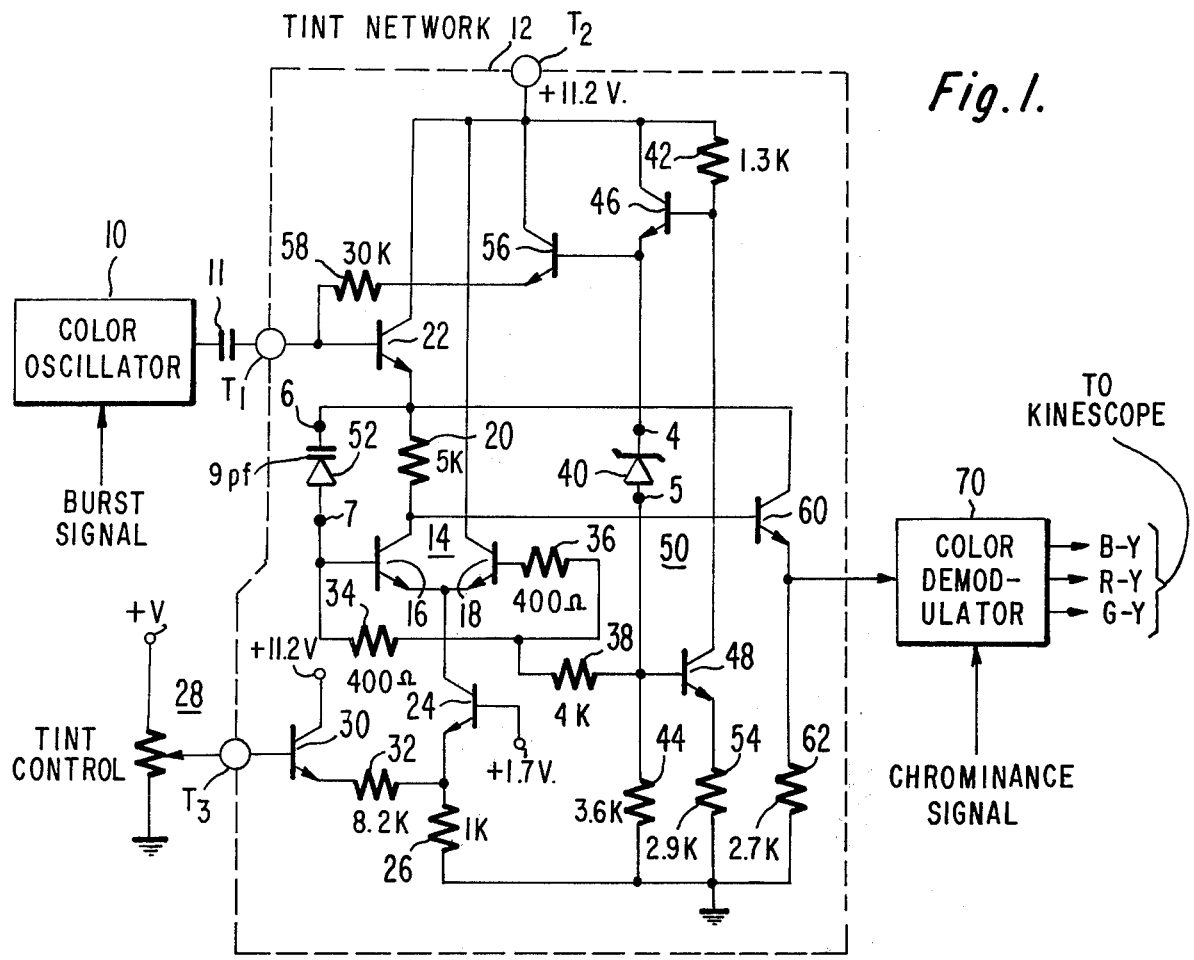
FIG. 1 is a diagram partially in block form and partially in schematic circuit form of a portion of a television receiver signal processing circuit employing the present invention.

In FIG. 1, continuous wave oscillatory signals at a television color subcarrier frequency (e.g., 3.58 MHz) are applied from the output of a color oscillator 10 to the input terminal $T_1$ of a tint network 12. Color oscillator 10 may be of the type included on the CA3126 integrated circuit marketed by RCA Corporation, Somerville, N. J., for example. For integrated circuit embodiments of tint network 12, terminal $T_1$ corresponds to an external terminal connection. As is customary, color oscillator 10 receives a separated oscillatory burst reference signal and is locked to the burst signal in phase and frequency. Tint network 12 serves to introduce a desired phase shift to the color oscillator signal prior to the application thereof to a suitable color demodulator 70.

Color demodulator 70 responds to the phase shifted output signal supplied by tint network 12 and to a chrominance signal derived from the transmitted composite signal in a well known manner. Output signals from the color demodulator, conventionally the color difference signals R-Y, G-Y and B-Y, are ultimately combined with luminance (Y) signals to produce red (R), green (G) and blue (B) color representative signal components which are applied in a known manner to the television receiver kinescope by suitable kinescope drive circuits (not shown).

Referring more particularly to the arrangement of tint network 12, output signals from color oscillator 10 are coupled to the base of a transistor 22 via a D.C. blocking capacitor 11 and a terminal $T_1$.

An emitter output of transistor 22 is coupled to a differential amplifier 14 via a resistor 20. Transistor 22 is arranged in emitter follower configuration and provides a relatively high impedance to preceding circuitry (i.e., color oscillator 10) while also representing a relatively low impedance signal source for supplying signals to be combined with the output of the differential amplifier 14.

Bias for the base of input follower transistor 22 is obtained from a bias network 50 via a transistor 56 and a resistor 58. Bias network 50 is coupled between an operating voltage supply terminal $T_2$ and ground. Network 50 comprises a feedback arrangement of transistors 46 and 48, resistors 42, 44 and 54 and a voltage stabilizing zener diode 40.

Bias resistor 42 is coupled between the operating supply and the base of bias transistor 46. Transistor 46 is arranged in common collector configuration with a collector coupled to the operating supply. A cathode of zener diode 40 is coupled to the emitter of transistor 46. An anode of zener diode 40 is returned to ground through bias resistor 44. Biasing resistors 42 and 44, together with bias transistor 46, are selected to reverse bias zener diode 40 at its rated zener voltage (e.g., about 5.6 volts).

The collector and emitter electrodes of transistor 48 are coupled to the operating supply and to ground through resistors 42 and 54, respectively. Transistor 48 insures that zener diode 40 is properly biased by maintaining a predictable voltage level at the base of transistor 46.

The bias coupling transistor 56 is arranged in common collector configuration with a base coupled to the cathode of zener diode 40 and a collector connected to the operating supply (+11.2 volts). The emitter of transistor 56 is coupled to the base of transistor 22 via resistor 58 which isolates bias network 50 (including zener diode 40) from the signal applied to the base of transistor 22.

Signals are also coupled from the emitter of transistor 22 via a capacitance 52 (which will be described subsequently) to one input of differential amplifier 14.

Differential amplifier 14 is formed by emitter coupled transistors 16 and 18 and a current source transistor 24. The collector of transistor 16 is coupled to the direct voltage operating supply (+11.2 v) at terminal $T_2$ via load resistor 20 and the collector-emitter path of transistor 22. The collector of transistor 18 is directly connected to the operating supply.

The emitter of current source transistor 24 is returned by a resistor 26 to a point of reference potential (ground). A source of direct bias potential (about +1.7 volts) is coupled to the base of transistor 24 and determines the quiescent current of transistor 24.

Operating bias is supplied to transistors 16 and 18 by means of resistors 34 and 36 coupled in series between the base electrodes of transistors 16 and 18, respectively. A resistor 38 couples the point of interconnection of resistors 34 and 36 remote from the base electrodes of transistors 16 and 18 to the anode of zener diode 40. Equal value resistors 34 and 36 insure that differential amplifier transistors 16 and 18 are biased for balanced operation. Resistor 34 together with resistor 38 also functions as part of a phase shift network including capacitance 52.

One terminal of capacitance 52 is supplied with a first fixed reference bias voltage from the cathode of zener diode 40 via transistors 22 and 56, while the other terminal of capacitance 52 is coupled to the anode of zener diode 40 via resistors 34 and 38. Capacitance 52, which is formed as a diode, is thereby maintained in a reverse bias mode to exhibit a suitable capacitance-voltage characteristic, and forms a portion of a phase shift network for signals supplied from transistor 22 to the base of transistor 16.

Phase shifted output signals are developed across load resistor 20 and are coupled to the base of an emitter follower transistor 60. Transistor 60 in turn supplies signals at a relatively low output impedance level to color demodulator 70. Transistor 60 has an emitter returned to ground via a resistor 62, and a collector coupled to the emitter of input transistor 22. The latter connection assures that transistor 22 remains in conduction by providing a path for its emitter current even when transistor 16 of differential amplifier 14 is rendered substantially non-conductive or cut-off.

Adjustment of the phase shift provided by tint network 12 is controlled by means of a tint control potentiometer 28. Tint control potentiometer 28 has first and second terminals connected respectively to ground and a direct operating potential source (+V) which may be relatively of the same magnitude as the operating potential for tint network 12. A wiper arm of potentiometer 28 is coupled to the base of a common collector transistor 30 via a terminal $T_3$. For integrated circuit embodiments of tint network 12, potentiometer 28 is located external to the integrated circuit with terminal $T_3$ corresponding to an external connection. Transistor 30 includes a collector coupled to the operating supply and an emitter coupled to the emitter of current source transistor 24 via a resistor 32.

Adjusting the potentiometer 28 wiper arm toward and away from its uppermost position (i.e., +V) causes the emitter current of transistor 24 and hence the total current available to transistors 16 and 18 to decrease and increase, respectively. The value of resistor 32 is selected to provide a desired degree of control over the current conduction of transistor 24 in response to movement of the potentiometer 28 wiper arm.

Figures 2, 3:
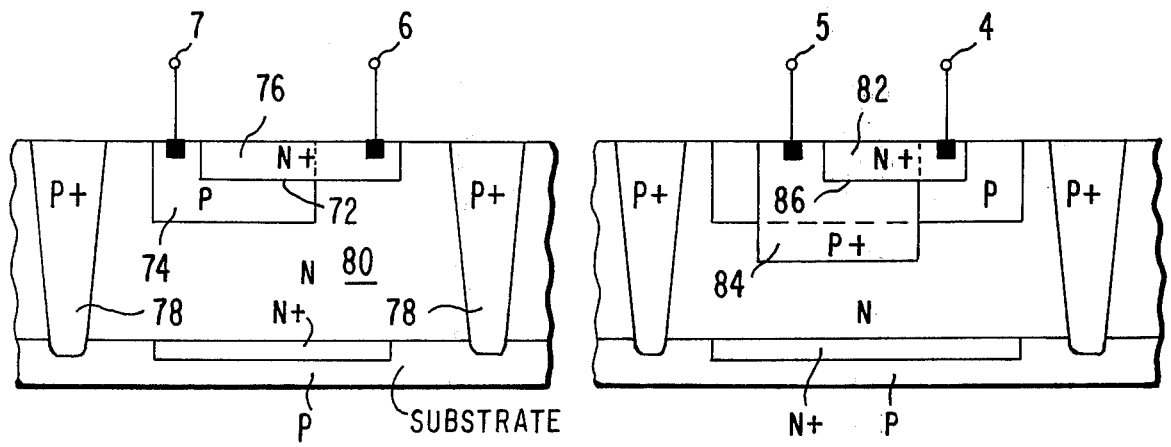
FIG. 2 is a diagrammatic cross-sectional view of a junction diode as may be used with the invention formed on an integrated circuit chip.
FIG. 3 is a diagrammatic cross-sectional view of a zener diode as may be used with the invention formed on an integrated circuit chip.

Diode 52 shown in FIG. 1 may be formed from suitable doped regions of N and P conductivity material in a monolithic integrated circuit as depicted by FIG. 2. The capacitance of the diode device is determined by the junction area 72 between a P type region 74 and an N+ type region 76 as well as to reverse biasing voltage applied between terminals 6 and 7. Regions of P+ type material 78 serve to isolate the diode device from other devices which may be included on the same chip.

It should be noted that, in practice, an N type region 80 and regions 74 and 76 may respectively correspond to collector, base and emitter regions of a transistor, with the base-emitter junction region 72 defining the capacitance junction. In such a capacitor, it is desirable to interconnect the collector and emitter regions. This is advantageously accomplished by fabrication in the format shown in FIG. 2, wherein the N+ emitter region 76 extends outside of base region 74, thereby overlapping collector region 80. The N+ and N regions 76, 80 thereby are interconnected without requiring additional metallization contacts. An economy is therefore realized in fabrication. The illustrated configuration exhibits, for example, a capacitance which varies 13 picofarads and 6 picofarads for applied reverse biasing voltages between 1 and 6 volts.

Referring to FIG. 3, zener diode 40 as shown in FIG. 1 may similarly be formed from suitably doped regions of N and P conductivity type material in an integrated circuit. Zener diode 40 in FIG. 3 comprises an N+ region 82 and a P+ region 84 defining a junction 86 therebetween. Regions 82 and 84 are suitably doped to provide a desired reverse breakdown (zener) voltage characteristic (e.g., 5.6 volts) for zener diode 40 in response to reverse biasing voltages applied to terminals 4 and 5.

Tint control network 12 shown in FIG. 1 operates as follows.

With the symmetrical biasing arrangement of transistors 16 and 18 as shown, the quiescent direct current in each of transistors 16 and 18 is equal to one-half the total current supplied by current source transistor 24 (about 1 milliampere in a typical case).

The signal from color oscillator 10 applied to terminal $T_1$ (of the order of 1 volt peak-to-peak), is coupled through follower transistor 22 to load resistor 20 and then to the base of output follower transistor 60. The phase of this signal component is substantially unchanged and, for purposes of convenience, may be designated as zero degrees phase. The signal from the emitter of transistor 22 also is phase shifted 45 degrees by diode 52 and resistors 34, 38 and properly applied to the base of transistor 16.

In the illustrated circuit, diode 52 is reverse biased at about 4 volts to provide a junction capacitance of about 9 picofarads. Diode 52 moreover is constructed to exhibit a reverse conduction breakdown voltage of about 6.8 volts (i.e., greater than the zener voltage of diode 40).

As noted above, zener diode 40 provides a zener voltage of about 5.6 volts, which voltage is reduced 1.5 volts in magnitude by the 0.75 volt base-emitter junction voltage drops of transistors 56 and 22. A further voltage drop across resistor 58 (of the order of 100 millivolts) is determined by the base current of transistor 22. The resulting substantially fixed bias voltage of about 4 volts reliably establishes the reverse bias voltage of diode 52 and hence its capacitance. The described biasing of diode 52 serves to prevent diode 52 from undesirably operating beyond its 6.8 volt reverse breakdown voltage point.

Alternating input signals supplied to diode 52 from terminal $T_1$ may tend to modulate the capacitance of diode 52 to a minor degree. However, any such modulation is negligible for all practical purposes, so that the capacitance of diode 52 effectively remains fixed as determined by the bias voltage supplied by the circuit including zener diode 40.

Phase shifted signals as the junction of diode 52 and resistor 34 are reduced in amplitude by the voltage divider action of resistors 34 and 38 to insure linear differential amplifier operation. A portion of the phase shifted signals developed across resistor 34 is applied to and amplified by differential amplifier 14.

An output signal developed across load resistor 20 thus comprises two vector signal quantities: the original signal at zero degrees phase, and the amplified phase shifted signal at 225° phase. The differential action of amplifier 14 contributes the additional 180° phase shift.

The amplitude of the signals produced by the differential amplifier 14 depends on the current conduction level or gain of differential amplifier 14, which in turn is a function of the control voltage applied at terminal $T_3$ from tint control potentiometer 28.

For example, when the wiper arm of potentiometer 28 is adjusted to its extreme position toward +V, current source transistor 24 and hence differential amplifier transistors 16 and 18 are rendered substantially non-conductive. Resistor 32 is dimensioned so that current source transistor 24 is cut-off for this position of potentiometer 28. At this control position, the relative phase of the signal developed across load resistor 20 is zero degrees (reference) phase, since substantially no current passes through transistor 16. That is, only the original signal at zero degrees phase, as coupled to load resistor 20 from follower transistor 22 is present.

Conversely, the current conduction or gain of differential amplifier 14 reaches a maximum when potentiometer 28 is adjusted to its other extreme toward ground. For this case, the signal developed across load resistor 20 includes the amplified phase-shifted component at 225° phase supplied by amplifier 14 in addition to the original signal at zero degrees reference phase supplied by transistor 22. The resultant of these two signal components is a signal having a phase angle of approximately −90° (270°), as established by the current conduction level (gain) of differential amplifier transistor 16 for this control position of potentiometer 28. Variable phase control is accomplished by varying the gain of differential amplifier 14 via potentiometer 28, thereby determining the magnitude of the complex vextor signal component at 225° phase and hence the phase of the resultant complex vector signal. The variable gain of differential amplifier 14 is substantially a linear function of the voltage applied to terminal $T_1$. Therefore, the phase control is essentially linear over its operating range.

Thus transistor 16 provides at its collector output a signal which is representative of the original color oscillator 10 signal as phase controlled by tint control network 12 in response to the setting of potentiometer 28. Prior to applying the output signal from follower transistor 60 to the color demodulator 70, the signal may be limited by a limiter-amplifier stage (not shown) to remove any undesired signal amplitude variations.

Although the invention has been disclosed in terms of a particular circuit embodiment, it should be recognized that other arrangements may be devised by those skilled in the art without departing from the scope of the invention. For example, the reference voltage provided by zener diode 40 in the disclosed circuit may also be provided by a series combination of forward biased semiconductor PN junctions each exhibiting a voltage drop on the order of 0.75 volts thereacross. In addition, other methods for isolating applied alternating signals from the source of reference voltage may include suitable capacitive filter networks, for example.

What is claimed is:
1. A phase shift circuit comprising:
   a source of input signals;
   phase shifting means including a semiconductor device having a PN junction exhibiting a capacitance thereacross when reversed biased, said phase shifting means having an input coupled to said source of input signal and an output for providing a phase shifted signal of a phase determined by the value of said capacitance;
   a continuously energized source of substantially constant bias reference voltage having a magnitude less than the reverse conduction breakdown voltage of said junction; and
   means for coupling said source of reference voltage across said device to reverse bias said junction, thereby establishing a substantially constant value of said capacitance and phase of said phase shifted signal, and inhibiting operation of said device beyond said reverse breakdown voltage in the presence of applied voltages having a magnitude tending to cause said operation.
2. A circuit according to claim 1, wherein said source of reference voltage comprises:
   a zener diode having anode and cathode electrodes respectively direct coupled to the corresponding electrodes of said semiconductor device; and
   biasing means coupled to said zener diode for reverse biasing said zener diode to determine said reference voltage.
3. A circuit according to claim 2 wherein:
   said zener diode exhibits a zener breakdown characteristic at a voltage level less than said reverse breakdown voltage of said PN junction.

4. A circuit according to claim 3 wherein:
said decoupling means includes signal isolation means for decoupling said source of reference voltage from said source of input signal.

5. A circuit according to claim 4 wherein:
said isolation means includes a resistance presenting a relatively high impedance path for said input signal.

6. A variable phase control circuit comprising:
a source of signals;
a phase shift network having an input coupled to said source and an output, and including a semiconductor device having a PN junction exhibiting a capacitance thereacross when reverse biased;
an amplifier having an input terminal coupled to said phase shift network output and an output terminal coupled to said source of signals;
variable control means coupled to said amplifier, for varying the amplifier gain and for thereby varying the amplitude of phase shifted signals provided at said output terminal;
a load impedance coupled to said output terminal for combining signals from said source and said varying amplitude phase shifted signals to produce combined signals;
a bias network providing a substantially constant reference voltage having a magnitude less than the reverse conduction breakdown voltage of said PN junction; and
coupling means for applying said reference voltage to said device to reverse bias said junction, thereby determining said capacitance and inhibiting operation of said device beyond said reverse breakdown voltage in the presence of applied voltages having a magnitude tending to cause said operation.

7. A circuit according to claim 6 wherein said bias network comprises:
a zener diode having anode and cathode electrodes and exhibiting a zener breakdown characteristic at a voltage level less than said reverse breakdown voltage of said PN junction; and
biasing means coupled to said zener diode for reverse biasing said zener diode to determine said reference voltage.

8. A circuit according to claim 7 wherein said biasing means comprises:
a first transistor having an emitter electrode coupled to said zener diode cathode;
a second transistor having base and collector electrodes respectively coupled to said zener diode anode and to the base of said first transistor; and
means for biasing said first and second transistors to establish the operating point of said zener diode.

9. A circuit according to claim 8 wherein said coupling means comprises:
a third transistor having base and collector electrodes respectively coupled to said zener diode cathode and to an operating potential;
a fourth transistor having a collector electrode coupled to an operating potential, a base electrode coupled to said source of signals, and an emitter output electrode coupled to said load impedance and to said semiconductor device input; and
direct coupled means coupled between the emitter electrode of said third transistor and said base electrode of said fourth transistor.

10. A circuit according to claim 9 wherein:
said direct coupling means includes a resistance for isolating said bias network reference voltage from said signals as applied to said fourth transistor.

* * * * *